United States Patent
Cho et al.

(10) Patent No.: US 8,119,425 B2
(45) Date of Patent: Feb. 21, 2012

(54) METHOD OF FORMING MAGNETIC MEMORY DEVICE

(75) Inventors: Woojin Cho, Yongin-si (KR); Jaeseung Hwang, Suwon-si (KR); Sukhun Choi, Suwon-si (KR); Dae Kyom Kim, Daejeon (KR); JungHyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 12/655,862

(22) Filed: Jan. 8, 2010

(65) Prior Publication Data

US 2010/0178714 A1    Jul. 15, 2010

(30) Foreign Application Priority Data

Jan. 9, 2009    (KR) .................. 10-2009-0001981

(51) Int. Cl.
H01L 21/00    (2006.01)
(52) U.S. Cl. .................... 438/3; 257/E21.665
(58) Field of Classification Search ............. 438/3; 257/E21.665
See application file for complete search history.

(56) References Cited

U.S. PATENT DOCUMENTS

| | | | |
|---|---|---|---|
| 6,424,508 B1* | 7/2002 | Tadokoro et al. | 360/324.2 |
| 6,845,038 B1* | 1/2005 | Shukh | 365/171 |
| 6,897,532 B1* | 5/2005 | Schwarz et al. | 257/367 |
| 6,917,499 B2* | 7/2005 | Ito et al. | 360/324.2 |
| 7,141,438 B2 | 11/2006 | Ha et al. | |
| 7,169,623 B2* | 1/2007 | Ditizio | 438/3 |
| 7,173,300 B2* | 2/2007 | Mizuguchi et al. | 257/295 |
| 7,531,367 B2* | 5/2009 | Assefa et al. | 438/3 |
| 2003/0231437 A1 | 12/2003 | Childress et al. | |
| 2004/0041182 A1* | 3/2004 | Tuttle et al. | 257/295 |
| 2004/0229430 A1* | 11/2004 | Findeis et al. | 438/257 |
| 2005/0035386 A1 | 2/2005 | Ha et al. | |
| 2005/0079638 A1* | 4/2005 | Drewes et al. | 438/3 |
| 2006/0051881 A1 | 3/2006 | Ditizio | |
| 2006/0186496 A1 | 8/2006 | Ditizio | |
| 2007/0041125 A1 | 2/2007 | Ha et al. | |
| 2007/0155027 A1 | 7/2007 | Ditizio | |

FOREIGN PATENT DOCUMENTS

KR    10-2004-0110482 A    12/2004
(Continued)

OTHER PUBLICATIONS

Winter, Mark, "Cobalt compounds," WebElements Periodic Table, Web, last downloaded Jan. 8, 2010, <http://www.webelements.com/compounds/cobalt.

(Continued)

*Primary Examiner* — Charles Garber
*Assistant Examiner* — Ron Pompey
(74) *Attorney, Agent, or Firm* — Onello & Mello, LLP

(57) ABSTRACT

There are provided a magnetic memory device and a method of forming the magnetic memory device. The method of forming the magnetic memory device includes sequentially forming a first magnetic conductor, a tunnel barrier layer, and a second magnetic conductor on a substrate, forming a mask pattern on the second magnetic conductor, performing a primary etching of the second magnetic conductor by using the mask pattern as an etching mask, forming at least one spacer on sidewalls of the second magnetic conductor formed by the primary etching, and performing a secondary etching of the first magnetic conductor by using the mask pattern and the at least one spacers as an etching mask.

9 Claims, 6 Drawing Sheets

FOREIGN PATENT DOCUMENTS

KR          10-0500455 B1      7/2005

OTHER PUBLICATIONS

Winter, Mark, "Iron compounds," WebElements Periodic Table, Web, last downloaded Jan. 8, 2010, <http://www.webelements.com/compounds/iron.

Winter, Mark, "Ruthenium compounds," WebElements Periodic Table, Web, last downloaded Jan. 8, 2010, <http://www.webelements.com/compounds/ruthenium.

Winter, Mark, "Platinum compounds," WebElements Periodic Table, Web, last downloaded Jan. 8, 2010, <http://www.webelements.com/compounds/platinum.

* cited by examiner

METHOD OF FORMING MAGNETIC MEMORY DEVICE

CROSS-REFERENCE TO RELATED APPLICATIONS

This application claims priority under 35 U.S.C. §119 to Korean Patent Application 10-2009-0001981, filed on Jan. 9, 2009 in the Korean Intellectual Property Office (KIPO), the entire contents of which are hereby incorporated by reference.

BACKGROUND

As electronic apparatuses continue to improve with regard to high processing speed and low power consumption, there is an increased demand for memory devices built into an electronic apparatus to have quick reading/writing features and a low operating voltage. Recent research suggests that a magnetic memory device can meet these demands. A magnetic memory device, which has characteristics including the ability to perform high-speed operations and/or be nonvolatile, has been identified as a next-generation memory device. A magnetic memory device may include a magnetic tunnel junction (MTJ) pattern. The magnetic tunnel junction pattern generally includes two magnetic bodies and an insulating layer positioned between the magnetic bodies. The resistance value of the magnetic tunnel junction pattern may vary depending on the magnetization directions of the two magnetic bodies. Specifically, if the magnetization directions of the two magnetic bodies are antiparallel with respect to each other, the resistance value of the magnetic tunnel junction pattern may be large. On the other hand, if the magnetization directions of the two magnetic bodies are parallel to each other, the resistance value of the magnetic tunnel junction pattern may be insufficiently small, since data may be written and/or read using the difference in the resistance value.

SUMMARY

According to one aspect, a method of forming a magnetic memory device comprises sequentially forming a first magnetic conductor, a tunnel barrier layer, and a second magnetic conductor on a substrate, forming a mask pattern on the second magnetic conductor, performing a primary etching of the second magnetic conductor by using the mask pattern as an etching mask, forming at least one spacer on a sidewall of the second magnetic conductor formed by the primary etching, and performing a secondary etching of the first magnetic conductor by using the mask pattern and the at least one spacer as an etching mask.

In an exemplary embodiment, a portion of the tunnel barrier layer is etched by the primary etching.

In an exemplary embodiment, a portion of the tunnel barrier layer and the second magnetic conductor are etched by the primary etching to form a sidewall of the second magnetic conductor and a sidewall of the tunnel barrier layer.

In an exemplary embodiment, the at least one spacer is formed on a sidewall of the second magnetic conductor and a sidewall of the tunnel barrier layer formed by the primary etching.

In an exemplary embodiment, the first magnetic conductor includes a pinning layer and a pinned layer that are laminated. In an exemplary embodiment, a portion of the pinned layer and the tunnel barrier layer are etched by the primary etching to form the sidewall of the tunnel barrier layer and the sidewall of the pinned layer. In an exemplary embodiment, the at least one spacer is formed on a sidewall of the second magnetic conductor, a sidewall of the tunnel barrier layer, and a sidewall of the pinned layer formed by the primary etching.

In an exemplary embodiment, the first magnetic conductor includes a pinning layer, a first ferromagnetic layer, a nonmagnetic layer, and a second ferromagnetic layer that are sequentially laminated, a portion of the second ferromagnetic layer, the second magnetic conductor, and the tunnel barrier layer are etched by the primary etching so that the sidewall of the tunnel barrier layer, the sidewall of the second magnetic conductor, and the sidewall of the second ferromagnetic layer are formed. in an exemplary embodiment, the at least one spacer is formed on a sidewall of the tunnel barrier layer, a sidewall of the second magnetic conductor, and a portion of at least one sidewall of the second ferromagnetic layer, which are formed by the primary etching.

In an exemplary embodiment, the first magnetic conductor includes a plurality of layers, wherein and at least one of the plurality of layers includes precious metals, and wherein the at least one layer including precious metals is not exposed before the secondary etching.

In an exemplary embodiment, the at least one spacer includes a plurality of layers.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings, the thickness of layers and regions are exaggerated for clarity. In the drawings.

DETAILED DESCRIPTION OF EMBODIMENTS

Magnetic memory devices and methods of forming the magnetic memory devices according to exemplary embodiments will be described below with reference to the accompanying drawings. Rather, these embodiments are provided so that this description will be thorough and complete, and will fully convey the scope of the inventive concepts to those skilled in the art. The present inventive concept may, however, be embodied in many different forms and should not be construed as limited to the exemplary embodiments set forth herein.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Although the terms first, second, and the like may be used in this specification to describe respective components or sections, these terms are used for clear description and these components or sections are not limited by these terms. The thicknesses and relative thicknesses of components shown in each drawing may be exaggerated to clearly describe the exemplary embodiments of the present inventive concepts.

Hereinafter, exemplary embodiments will be described in detail with reference to the accompanying drawings.

FIGS. 1 to 4 are cross-sectional views illustrating a method of forming a magnetic memory device according to an exemplary embodiment.

Figure 1:
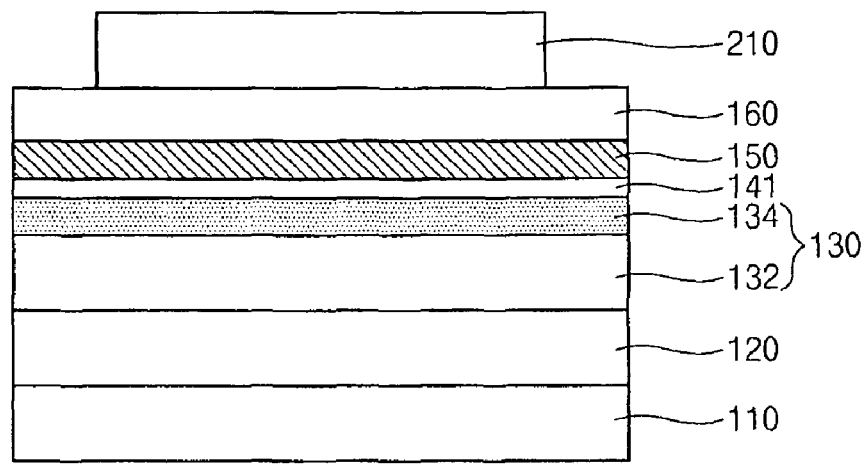
FIGS. 1 to 4 are cross-sectional views illustrating a method of forming a magnetic memory device according to an exemplary embodiment.

Referring to FIG. 1, a lower electrode layer 120 may be formed on a substrate 110. In an embodiment, the substrate 110 may be a semiconductor-based substrate. The substrate 110 may include a conductive region and/or an active region. The lower electrode layer 120 may be electrically connected to the active region of the substrate 110.

A first magnetic conductor layer 130 is formed on the lower electrode layer 120. The first magnetic conductor layer 130 may include a layer that has a fixed magnetization direction. When referring to a layer that has a fixed magnetization direction, one of skill in the art understands that a material included in the layer can have an inherent fixed magnetization direction or the material included in the layer can acquire a fixed magnetization direction, wherein electric and/or magnetic factors are provided to the material in the event that the material does not have an inherent fixed magnetization direction.

The first magnetic conductor layer 130 may include a plurality of layers. In an embodiment, the first magnetic conductor layer 130 may include a pinning layer 132 adjacent to the substrate 110 and a pinned layer 134 on the pinning layer 132. The magnetization direction of the pinned layer 134 may be fixed in one direction by the pinning layer 132. For at least this reason, the pinned layer 134 may have a fixed magnetization direction.

The pinning layer 132 may include an anti-ferromagnetic material. The pinning layer 132 may include at least one selected from the group consisting of PtMn, IrMn, MnO, MnS, MnTe, $MnF_2$, $FeCl_2$, FeO, $CoCl_2$, CoO, $NiCl_2$, NiO, and Cr. In the exemplary embodiment, the pinning layer 132 may include at least one precious metal. The precious metal or metals may include ruthenium (Ru), rhodium (Rh), palladium (Pd), osmium (Os), iridium (Ir), platinum (Pt), gold (Au), and silver (Ag).

The pinned layer 134 may include ferromagnetic materials. In the exemplary embodiment, the pinned layer 134 may include a single layer that includes ferromagnetic materials. For example, the pinned layer 134 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

A tunnel barrier layer 141 may be formed on the pinned layer 134. The tunnel barrier layer 141 may include a nonmagnetic insulating material. In an embodiment, the tunnel barrier layer 141 may include magnesium oxide (MgO). In another embodiment, the tunnel barrier layer 141 may include aluminum oxide (AlO).

A second magnetic conductor 150 may be formed on the tunnel barrier layer 141. The second magnetic conductor 150 may include a material that has a changeable magnetization direction. The second magnetic conductor 150 may include ferromagnetic materials. For example, the second magnetic conductor 150 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

An upper electrode layer 160 may be formed on the second magnetic conductor 150. A capping layer (not shown) may also be formed between the second magnetic conductor 150 and the upper electrode layer 160. A mask pattern 210 is formed on the upper electrode layer 160.

Figure 2:
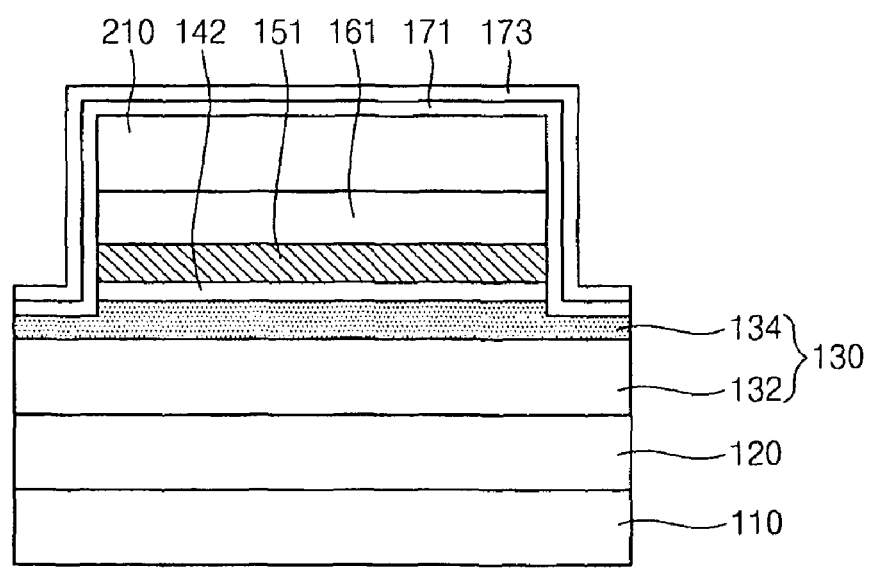

Referring to FIG. 2, a primary etching process may be performed using the mask pattern 210 as an etching mask. The upper electrode layer 160 and the second magnetic conductor 150 may be etched by the primary etching process. Accordingly, a second magnetic conductive pattern 151 and an upper electrode 161 including sidewalls, which are self-aligned with a sidewall of the mask pattern 210, may be formed from the upper electrode layer 160 and second magnetic conductor 150, respectively.

During the primary etching process, the tunnel barrier layer 141 is etched, and a tunnel barrier pattern 142 may then be formed from the tunnel barrier layer 141. The tunnel barrier pattern 142 may include sidewalls that are self-aligned with the sidewalls of the mask pattern 210 and the second magnetic conductive pattern 151.

The primary etching process may be performed before the pinning layer 132 of the first magnetic conductor layer 130 is exposed. In an embodiment, the primary etching process may be performed using the pinned layer 134 as an end point. The end point may be detected by an optical emission spectroscope. Specifically, the primary etching process may be performed until the emission wavelength of any one of elements included in the pinned layer 134 is detected. In another embodiment, the primary etching process may be performed using the tunnel barrier layer 141 as an end point.

A portion of the pinned layer 134 may be etched by the primary etching process. Accordingly, an upper portion of the pinned layer 134, which is positioned below the mask pattern 210, may include a sidewall which is aligned with the sidewall of the mask pattern 210. Alternatively, in embodiments where the primary etching process is performed using the tunnel barrier layer 141 as an end point, the pinned layer 134 may not be etched in the primary etching process. In this case, the upper portion of the tunnel barrier layer 141, which is positioned below the mask pattern 210, may include at least one sidewall that is aligned with at least one sidewall of the mask pattern 210.

Spacer layers 171 and 173 may be formed on the second magnetic conductive pattern 151. The spacer layers 171 and 173 may be conformally formed on an upper surface and a sidewall of the second magnetic conductive pattern 151. The spacer layers 171 and 173 may cover the sidewall of the second magnetic conductive pattern 151. The spacer layers 171 and 173 may further cover the sidewalls of the tunnel barrier pattern 142.

In the exemplary embodiment, the spacer layers 171 and 173 may include a plurality of layers. In some embodiments, the spacer layers 171 and 173 may include a first spacer layer 171 and a second spacer layer 173 on the first spacer layer 171. In other embodiments, the spacer layers 171 and 173 may be a single layer.

The spacer layers 171 and 173 may include at least one selected from various insulating materials. For example, the first and second spacer layers 171 and 173 may include at least one selected from a metal oxide, a Group 4A element oxide, and a Group 4A element nitride, respectively. In the exemplary embodiment, the first spacer layer 171 may include an aluminum oxide, and the second spacer layer 173 may include silicon nitride.

Figure 3:
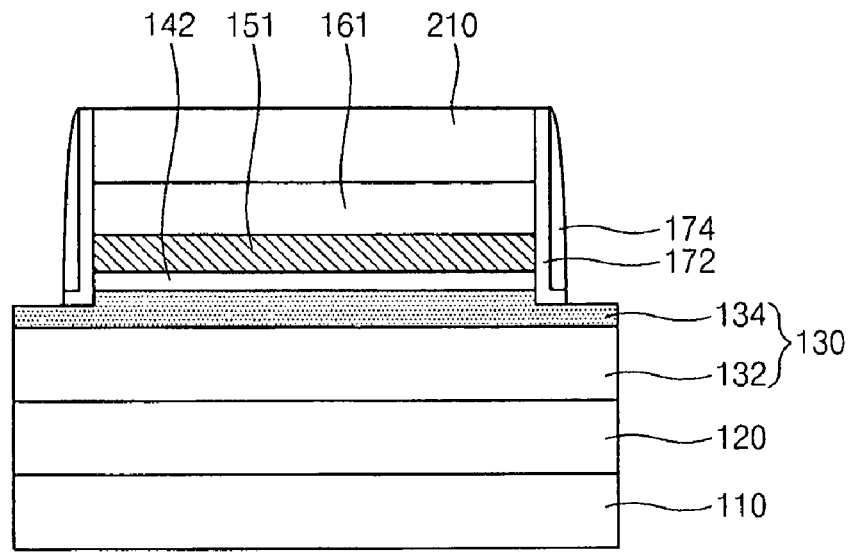

Referring to FIG. 3, the spacer layers 171 and 173 are partially removed to form first and second spacers 172 and 174, respectively, on at least one sidewall of the second magnetic conductive pattern 151. The first spacer 172 is adjacent to the sidewall of the pinned layer 134, and the second spacer 174 is on the first spacer 172. The first and second spacers 172 and 174 may be formed by performing an anisotropic etching of the spacer layers 171 and 173. The portions of the spacer layers 171 and 173, which are formed on the upper surface of the mask pattern 210 and the upper surface of the pinned layer 134, may be removed. Alternatively, in the case when the pinned layer 134 is not etched in the primary etching process, the portions of the spacer layers 171 and 173, which are formed on the upper surface of the second magnetic conductive pattern 151 and the upper surface of the tunnel barrier layer 141, may be removed.

Figure 4:
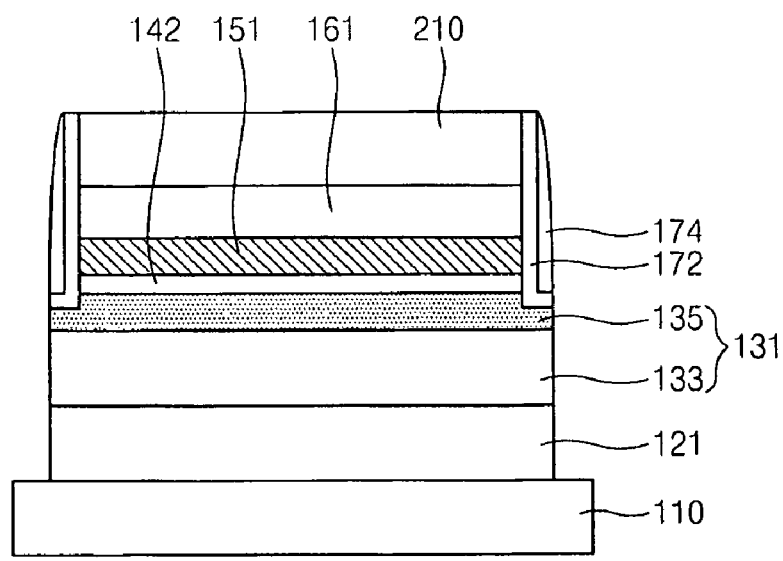

Referring to FIG. 4, a secondary etching process is performed using the spacers 172 and 174 and the mask pattern 210 as an etching mask. The first magnetic conductor layer 130 is etched by the secondary etching process so that a first magnetic conductive pattern 131 may be formed from the first magnetic conductor layer 130. The first magnetic conductive pattern 131 may include at least one sidewall that are self-aligned with the sidewalls of the spacers 172 and 174.

The secondary etching process may be performed by sputtering. When the first magnetic conductor layer 130 is etched by the secondary etching process, etching by-products may be generated. The etching by-products may include conductive materials. A portion of the conductive materials may not easily be oxidized nor hardly lose conductivity even if being oxidized. In the exemplary embodiment, the etching by-products of the pinning layer 132 may include one or more precious metals. Since the precious metal is not easily oxidized, a part of the etching by-products of the pinning layer 132 may have conductive properties.

If the conductive etching by-products are attached to the second magnetic conductive pattern 151, a shorting phenomenon may occur during the operation of a magnetic memory cell including the second magnetic conductive pattern. However, according to the exemplary embodiments, when the secondary etching process is performed, the sidewalls of the second magnetic conductive pattern 151 may be covered with the spacers 172 and 174. According to the exemplary embodiments since the pinning layer 132 is not etched in the primary etching process, the etching by-products of the pinning layer 132 are not generated in the primary etching process. This can minimize any attaching of conductive etching by-products to the second magnetic conductive pattern 151.

The mask pattern 210 may be removed after the secondary etching process. A portion of the mask pattern 210 may be removed in the secondary etching process. Alternatively, the mask pattern 210 may remain. The spacers 172 and 174 may be removed after the secondary etching process, or may remain on the second magnetic conductive pattern 151.

A magnetic memory device according to an exemplary embodiment will be further described with reference FIG. 4. Some of details described with reference to FIGS. 1 to 4 may be omitted.

Lower and upper electrodes 121 and 161 may be disposed on a substrate 110. In some embodiments, a first magnetic conductive pattern 131, a tunnel barrier pattern 142, and a second magnetic conductive pattern 151 may be laminated sequentially between the lower and upper electrodes 121 and 161. A capping layer (not shown) may be formed between the second magnetic conductive pattern 151 and the upper electrode 161. In other embodiments, the first magnetic conductive pattern 131, the tunnel barrier pattern 142, and the second magnetic conductive pattern 151 may be laminated in an order on the substrate 110 that is different than the order shown in FIG. 4. For example, the second magnetic conductive pattern 151, the tunnel barrier pattern 142, and the first magnetic conductive pattern 131 may be laminated sequentially on the substrate 110.

The first magnetic conductive pattern 131 may include a layer that includes a material having a fixed magnetization direction. The first magnetic conductive pattern 131 may further include a layer that includes a material for fixing the magnetization direction of the layer. For example, the first magnetic conductive pattern 131 may include a pinning pattern 133 adjacent to the lower electrode 121 and a pinned pattern 135 formed on the pinning pattern 133.

The pinning pattern 133 may fix the magnetization direction of the pinned pattern 135. The pinning pattern 133 may include an anti-ferromagnetic material. The pinned pattern 135 may have a magnetization direction that is fixed by the pinning pattern 133. The pinned pattern 135 may include ferromagnetic materials.

The pinned pattern 135 may have upper and lower portions that have different widths. In one embodiment, the lower portion of the pinned pattern 135 may be larger in width than the upper portion of the pinned pattern. The upper portion of the pinned pattern 135 may include sidewalls that are coplanar with the sidewalls of the second magnetic conductive pattern 151 and the tunnel barrier pattern 142. The lower portion of the pinned pattern 135 may include a sidewall that is coplanar with a sidewall of the first magnetic conductor 131.

The tunnel barrier pattern 142 may include a nonmagnetic insulating material. In an embodiment, the tunnel barrier pattern 142 may include magnesium oxide (MgO). In an embodiment, the tunnel barrier pattern 142 may include aluminum oxide (AlO).

The second magnetic conductive pattern 151 may include a material of which the magnetization direction is changeable. The magnetization direction of the second magnetic conductive pattern 151 may be changed by electric/magnetic factors that are provided outside and/or inside a magnetic memory cell. A value of the magneto-resistance of the magnetic memory cell, which includes the second magnetic conductive pattern 151 and the first magnetic conductive pattern 131, may be changed depending on whether the magnetization direction of the second magnetic conductive pattern 151 is parallel to the magnetization direction of the first magnetic conductive pattern 131. Accordingly, data may be written in and/or read out from the magnetic memory cell.

Spacers 172 and 174 may be disposed on the sidewalls of the second magnetic conductive pattern 151, and a mask pattern 210 may be formed on the upper surface of the second magnetic conductive pattern 151. Alternatively, the spacers 172 and 174 and/or the mask pattern 210 may be omitted.

A method of forming a magnetic memory device according to another exemplary embodiment will be described with reference to FIGS. 5 to 8.

Figure 5:
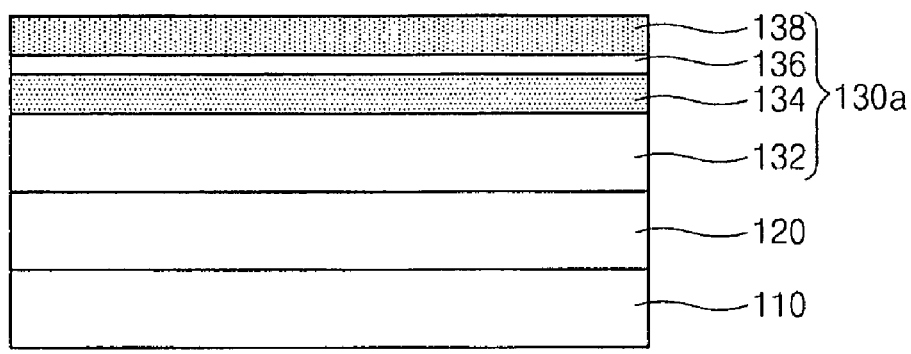
FIGS. 5 to 9 are cross-sectional views illustrating a method of forming a magnetic memory device according to another exemplary embodiment.

Referring to FIG. 5, a lower electrode layer 120 may be formed on a substrate 110. In an embodiment, the substrate 110 may be a semiconductor-based substrate. The substrate 110 may include a conductive region and/or an active region. The lower electrode layer 120 may be electrically connected to the active region of the substrate 110. The lower electrode layer 120 may be formed in the shape of an electrode or an electrode contact.

A first magnetic conductor layer 130a is formed on the lower electrode layer 120. The first magnetic conductor layer 130a may include a layer that includes a material having a fixed magnetization direction. The first magnetic conductor layer 130a may include a plurality of layers. For example, the first magnetic conductor layer 130a may include a pinning layer 132 and pinned layers 134 and 138 that are formed on the pinning layer 132.

The pinning layer 132 may fix the magnetization directions of the materials of the pinned layers 134 and 138. The pinning layer 132 may include at least one selected from PtMn, IrMn, MnO, MnS, MnTe, $MnF_2$, $FeCl_2$, FeO, $CoCl_2$, CoO, $NiCl_2$, NiO, and Cr. In some exemplary embodiments, the pinning layer 132 may include precious metals.

The pinned layers 134 and 138 may have a magnetization direction that is fixed by the pinning layer 132. In the exemplary embodiment, the pinned layers 134 and 138 may include a plurality of layers. If the pinned layers 134 and 138 include a plurality of layers, the pinned layers 134 and 138 may include a first ferromagnetic layer 134 and a second ferromagnetic layer 138, which are laminated. A nonmagnetic layer 136 may be interposed between the first and second ferromagnetic layers 134 and 138. Alternatively, a single pinned layer including ferromagnetic material can be provided instead of multiple pinned layers.

In the abovementioned exemplary embodiment, the magnetization direction of the first ferromagnetic layer 134 may be fixed by the pinning layer 132. The magnetization direction of the second pinned layer 138 may be fixed to be antiparallel to the magnetization direction of the first ferromagnetic layer 134. The magnetization directions of the first and second ferromagnetic layers 134 and 138 may be fixed to be antiparallel with respect to each other by the nonmagnetic layer 136.

The first and second ferromagnetic layers 134 and 138 may include ferromagnetic materials respectively. For example, the first and second ferromagnetic layers 134 and 138 may include at least one selected form CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The nonmagnetic layer 136 may include precious metals. For example, the nonmagnetic layer 136 may include at least one selected from ruthenium (Ru), iridium (Ir), and rhodium (Rh).

Figure 6:
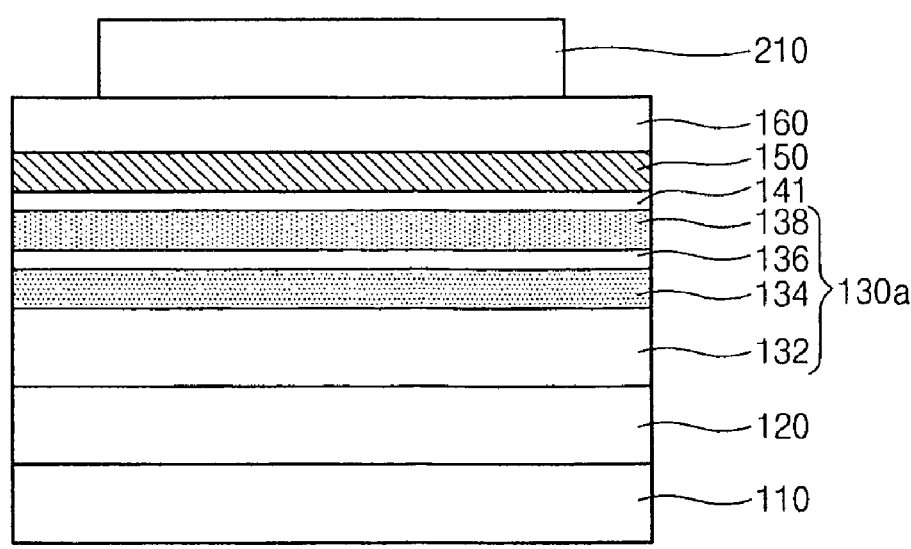

Referring to FIG. 6, a tunnel barrier layer 141 may be formed on the first magnetic conductor layer 130a. The tunnel barrier layer 141 may be formed by at least one selected from various layer forming processes such as a chemical vapor deposition and an atomic layer deposition. In an embodiment, the tunnel barrier layer 141 may include magnesium oxide (MgO). In another embodiment, the tunnel barrier layer 141 may include aluminum oxide (AlO).

A second magnetic conductor 150 may be formed on the tunnel barrier layer 141. The second magnetic conductor 150 may include a material that has a changeable magnetization direction. In the exemplary embodiment, the second magnetic conductor 150 may include one layer that includes ferromagnetic materials. In another exemplary embodiment, the second magnetic conductor 150 may include a plurality of layers. In an embodiment, the second magnetic conductor 150 may include a plurality of layers that includes ferromagnetic materials and nonmagnetic layers interposed between the plurality of layers.

An upper electrode layer 160 may be formed on the second magnetic conductor 150. A capping layer (not shown) may also be formed between the second magnetic conductor 151 and the upper electrode layer 160. A mask pattern 210 may be formed on the upper electrode layer 160.

Figure 7:
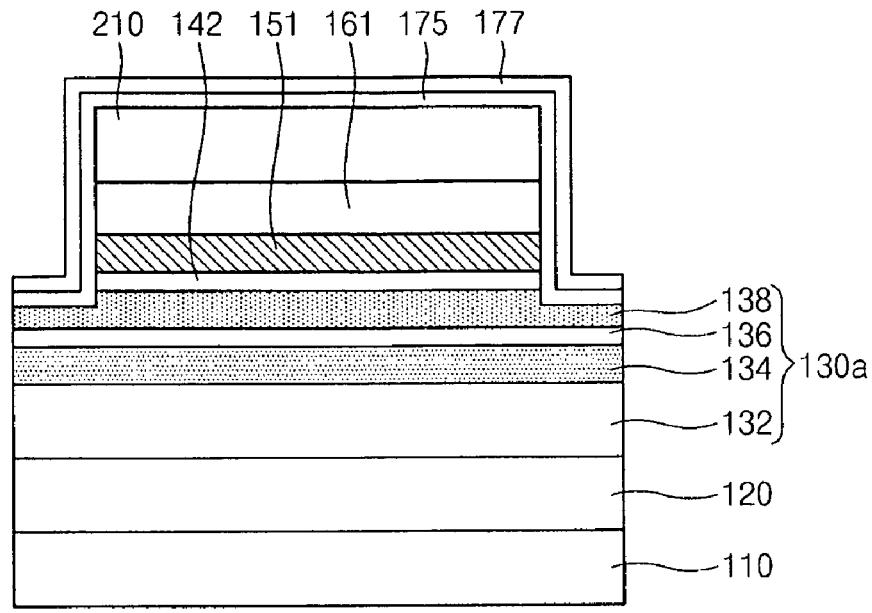

Referring to FIG. 7, a primary etching process may be performed using the mask pattern 210 as an etching mask. The upper electrode layer 160, the second magnetic conductor 150, and the tunnel barrier layer 141 may be etched by the primary etching process to form an upper electrode 161, a second magnetic conductive pattern 151, and a tunnel barrier pattern 142, respectively. The second magnetic conductive pattern 151 and the tunnel barrier pattern 142 are formed by the primary etching process and include sidewalls that are self-aligned with a sidewall of the mask pattern 210.

The primary etching process may be performed by sputtering. For example, the primary etching process may be performed by ion sputtering. In the primary etching process, an end point may be detected by an optical emission spectroscope. For example, when the primary etching process is intended to be performed using the second ferromagnetic layer 138 as the end point, the primary etching process may be performed until the emission wavelength of at least one of elements included in the second ferromagnetic layer 138 is detected.

A portion of the second ferromagnetic layer 138 is etched in the primary etching process to form an upper sidewall of the second ferromagnetic layer 138. The upper sidewall of the second ferromagnetic layer 138 may be self-aligned with the sidewalls of the mask pattern 210, the second magnetic conductive pattern 151, and the tunnel barrier pattern 142. The second ferromagnetic layer 138 under the mask pattern 210, may include at least one sidewall that is aligned with at least one sidewall of the mask pattern 210.

Spacer layers 175 and 177 may be formed on the second magnetic conductive pattern 151. The spacer layers 175 and 177 may be conformally formed on the upper surface and sidewall of the second magnetic conductive pattern 151. The spacer layers 175 and 177 may cover the sidewalls of the second magnetic conductive pattern 151 and the tunnel barrier pattern 142.

The spacer layers 175 and 177 may include a plurality of layers. For example, the spacer layers 175 and 177 may include a first spacer layer 175 adjacent to the second magnetic conductive pattern 151 and a second spacer layer 177 formed on the first spacer layer 175. Alternatively, the spacer layers 175 and 177 may be a single layer.

Each of the spacer layers 175 and 177 may include at least one material selected from various insulating materials. For example, each of the first and second spacer layers 175 and 177 may include at least one material selected from a metal oxide, a Group 4A element oxide, and a Group 4A element nitride. In the exemplary embodiment, the first spacer layer 175 may include an aluminum oxide, and the second spacer layer 177 may include a silicon nitride.

Figure 8:
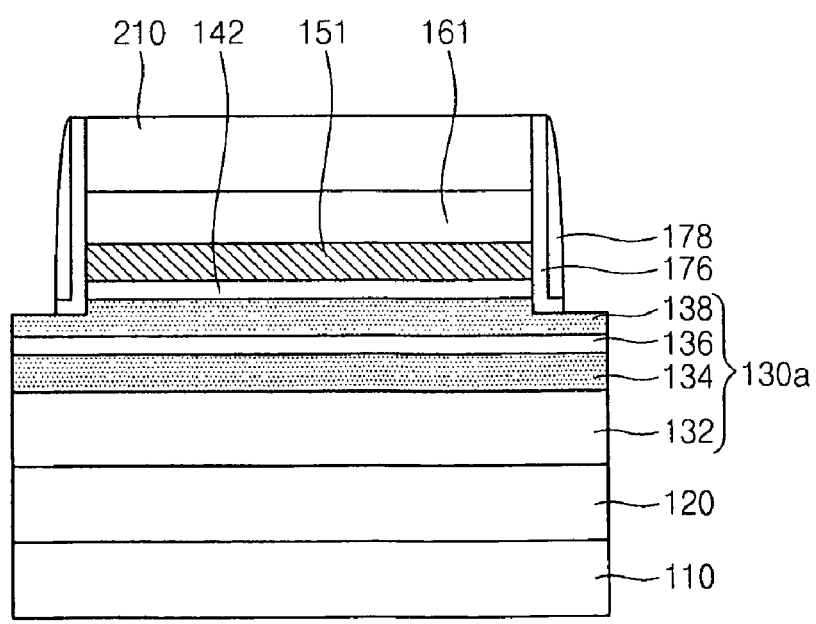

Referring to FIG. 8, the spacer layers 175 and 177 are partially etched and spacers 176 and 178 are formed. The spacers 176 and 178 may be formed by removing portions of the spacer layers 175 and 177 that are formed on the upper surface of the mask pattern 210 and the first magnetic conductor layer 130a. The spacers 176 and 178 may cover the sidewalls of the second magnetic conductive pattern 151. The spacers 176 and 178 may extend onto the sidewall of the tunnel barrier pattern 142.

Figure 9:
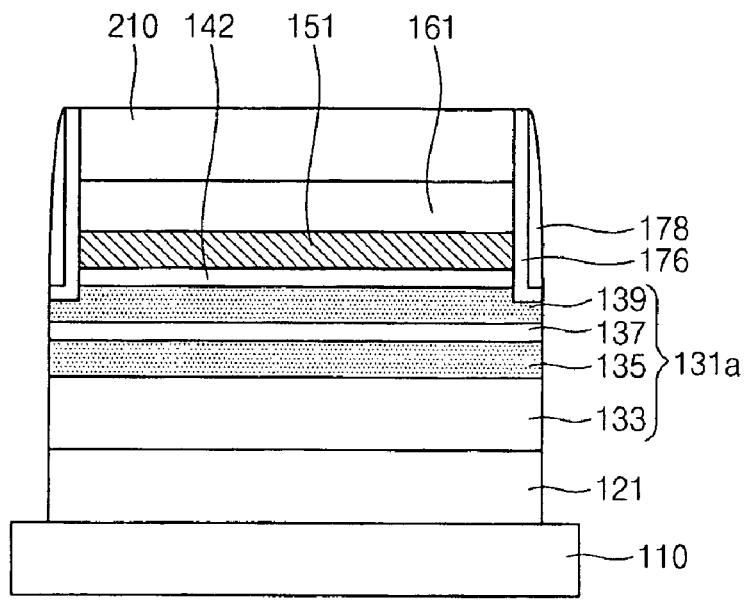

Referring to FIG. 9, a secondary etching process may be performed using the mask pattern 210 and the spacers 176 and 178 as an etching mask. The secondary etching process may include a process for forming a first magnetic conductive pattern 131a by etching the first magnetic conductor layer 130a. The sidewalls of the first magnetic conductive pattern 131a may be self-aligned with the sidewalls of the spacers 176 and 178. The secondary etching process may further include a process for forming a lower electrode 121 by etching the lower electrode layer 120.

Etching by-products of the first magnetic conductor layer 130a may be produced during the secondary etching process. At least a portion of the etching by-products may include conductive materials. Further, a portion of the conductive materials may not easily be oxidized or keep conductivity even if being oxidized. In one embodiment, the etching by-products of the nonmagnetic layer 136 and/or the pinning layer 132, which are produced during the secondary etching process, may include precious metals. The precious metal may not be easily oxidized, thereby having conductivity. If the etching by-products of the nonmagnetic layer 136 and/or the pinning layer 132, which are generated in the secondary etching process, are attached to the second magnetic conductive pattern 151, a shorting phenomenon may occur in a magnetic memory cell including the second magnetic conductive pattern. However, according to the exemplary embodiments, since the spacers 176 and 178 cover the sidewalls of the second magnetic conductive pattern 151, it may be possible to prevent the conductive etching by-products from being attached to the second magnetic conductive pattern 151. Additionally, since the primary etching process is performed before the nonmagnetic layer 136 is exposed, the etching by-products of the nonmagnetic layer 136 may not be generated in the primary etching process. Accordingly, it can minimize the defects of the magnetic memory cell due to the etching by-products.

In addition, according to the exemplary embodiments, an additional masking process may not essential for the secondary etching process. In the exemplary embodiments, an upper laminated structure, which includes the mask pattern 210, the second magnetic conductive pattern 151, the tunnel barrier pattern 142, and the second ferromagnetic layer 138, may be used as an etching mask. Accordingly, an etching process may be simplified. Further, it can prevent misalignment that may be caused by forming a separate mask.

The mask pattern 210 may be removed after and/or during the secondary etching process. The spacers 176 and 178 may be removed after and/or during the secondary etching process. Alternatively, the mask pattern 210 and/or spacers 176 and 178 may remain without being removed.

A magnetic memory device according to another exemplary embodiment will be described with reference to FIG. 9. Some of details described with reference to FIGS. 5 to 9 may be omitted.

Lower and upper electrodes 121 and 161 may be disposed on a substrate 110. In some embodiments, a first magnetic conductive pattern 131a, a tunnel barrier pattern 142, and a second magnetic conductive pattern 151 may be laminated sequentially between the lower and upper electrodes 121 and 161. A capping layer (not shown) may be further formed between the second magnetic conductive pattern 151 and the upper electrode 161. In other embodiments, the first magnetic conductive pattern 131a, the tunnel barrier pattern 142, and the second magnetic conductive pattern 151 may be laminated in an order on the substrate 110 that is different than the order shown in FIG. 9. For example, the second magnetic conductive pattern 151, the tunnel barrier pattern 142, and the first magnetic conductive pattern 131a may be laminated in this order on the substrate 110.

The first magnetic conductive pattern 131a may include a layer that includes a material having a fixed magnetization direction. The first magnetic conductive pattern 131a may further include a layer that includes a material for fixing the magnetization direction of the layer. For example, the first magnetic conductive pattern 131a may include a pinning pattern 133 adjacent to the lower electrode 121 and pinned patterns 135 and 139 formed on the pinning pattern 133.

The pinning pattern 133 may fix the magnetization directions of the pinned patterns 135 and 139. The pinning pattern 133 may include an anti-ferromagnetic material.

The pinned patterns 135 and 139 may have a magnetization direction that is fixed by the pinning pattern 133. The pinned patterns 135 and 139 may include a plurality of layers. The pinned patterns 135 and 139 may include a first ferromagnetic pattern 135 that has a magnetization direction fixed to one direction by the pinning pattern 133 and a second ferromagnetic pattern 139 that has a magnetization direction antiparallel to the magnetization direction of the first ferromagnetic pattern 135. A nonmagnetic layer 137 may be interposed between the first and second ferromagnetic patterns 135 and 139 to fix the magnetization directions of the first and second ferromagnetic patterns 135 and 139 to be antiparallel with respect to each other.

The second ferromagnetic pattern 139 may have upper and lower portions that have different widths. In the exemplary embodiment, the lower portion of the second ferromagnetic pattern 139 may be larger in width than the upper portion of the second ferromagnetic pattern. The upper portion of the second ferromagnetic pattern 139 may include a sidewall that is coplanar with the sidewalls of the second magnetic conductive pattern 151 and the tunnel barrier pattern 142. The lower portion of the second pinned pattern 139 may include sidewalls that are coplanar with the sidewalls of the first magnetic conductive pattern 131a.

The tunnel barrier pattern 142 may include a nonmagnetic insulating material. The tunnel barrier pattern 142 may include a magnesium oxide or an aluminum oxide.

The second magnetic conductive pattern 151 may include a material having a changeable magnetization direction. The magnetization direction of the second magnetic conductive pattern 151 may be changed by electric/magnetic factors that are provided outside and/or inside a magnetic memory cell. A value of the magneto resistance of the magnetic memory cell, which includes the second magnetic conductive pattern and the first magnetic conductive pattern, may be changed depending on whether the magnetization direction of the second magnetic conductive pattern 151 is parallel to the magnetization direction of the first magnetic conductive pattern 131a. Data may be written in and/or read out from the magnetic memory cell by using this.

The second magnetic conductive pattern 151 may include ferromagnetic materials. In the exemplary embodiment, the second magnetic conductive pattern 151 may be formed of a plurality of layers. For example, the second magnetic conductive pattern may include layers that include a plurality of ferromagnetic materials and layers that include nonmagnetic materials interposed between the layers. In this case, the layers including the ferromagnetic materials and the layers including nonmagnetic materials may form a synthetic anti-ferromagnetic (SAF) layer. In embodiments where the second magnetic conductive pattern 151 is formed of a synthetic antiferromagnetic layer, the thermal stability of the second magnetic conductive pattern 151 may further be improved.

In some embodiments, as shown in FIG. 9, spacers 176 and 178 may be formed on the side walls of the second magnetic conductive pattern 151. A mask pattern 210 may be provided on the upper surface of the second magnetic conductive pattern 151. In other embodiments, the spacers 176 and 178 and/or the mask pattern 210 may be omitted.

A method of forming a magnetic memory device according to still another exemplary embodiment will be described with reference to FIGS. 10 to 12.

Figure 10:
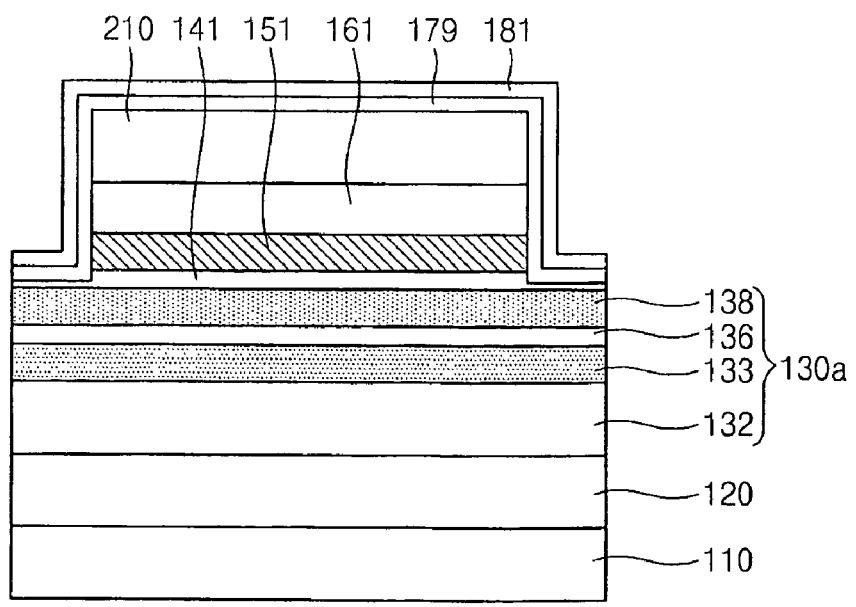
FIGS. 10 to 12 are cross-sectional views illustrating a method of forming a magnetic memory device according to still another exemplary embodiment.

Referring to FIG. 10, the second magnetic conductor 150 illustrated in FIG. 6 is patterned to form a second magnetic conductive pattern 151. A process for patterning the second magnetic conductor 150 may include forming a mask pattern 210 on the second magnetic conductor 150 and performing a primary etching process using the mask pattern 210 as an etching mask. The second magnetic conductive pattern 151, which is formed by the primary etching process, may include sidewalls that are self-aligned with the sidewalls of the mask pattern 210. An upper electrode layer, for example, upper electrode layer 160 of FIG. 6, is patterned in the primary etching process to form an upper electrode 161.

The secondary etching process may be performed by a sputtering method. For example, the secondary etching process may be performed by ion sputtering. The secondary etching process may be performed using the tunnel barrier layer 141 as an end point. The end point may be detected by an optical emission spectroscope.

A portion of the tunnel barrier layer 141 may be etched in the secondary etching process. Accordingly, the tunnel barrier layer 141 may have an upper portion that includes a sidewall aligned with the sidewalls of the mask pattern 210 and the second magnetic conductive pattern 151.

Spacer layers 179 and 181 may be formed on the second magnetic conductive pattern 151. The spacer layers 179 and 181 may be conformally formed on an upper surface and a sidewall of the second magnetic conductive pattern 151. The spacer layers 179 and 181 may cover at least a portion of the sidewall of the tunnel barrier layer 140. For example, the spacer layers 179 and 181 may cover an upper sidewall of the tunnel barrier layer 141.

The spacer layers 179 and 181 may include a plurality of layers. In the exemplary embodiment, the spacer layers 179 and 181 may be formed of a first spacer layer 179 adjacent to the second magnetic conductive pattern 151 and a second spacer layer 181 formed on the first spacer layer 179. Alternatively, the spacer layers 179 and 181 may be a single layer.

Figure 11:
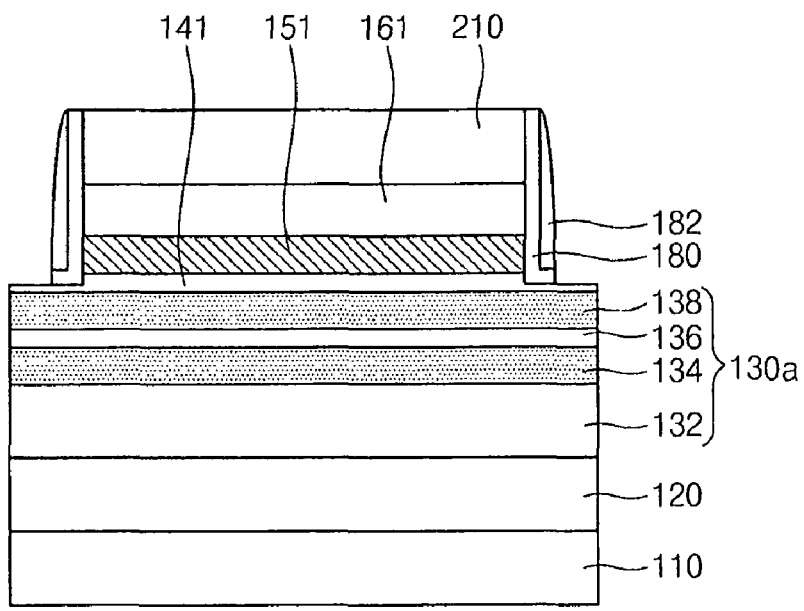

Referring to FIG. 11, the spacer layers 179 and 181 are etched to form spacers 180 and 182.

Figure 12:
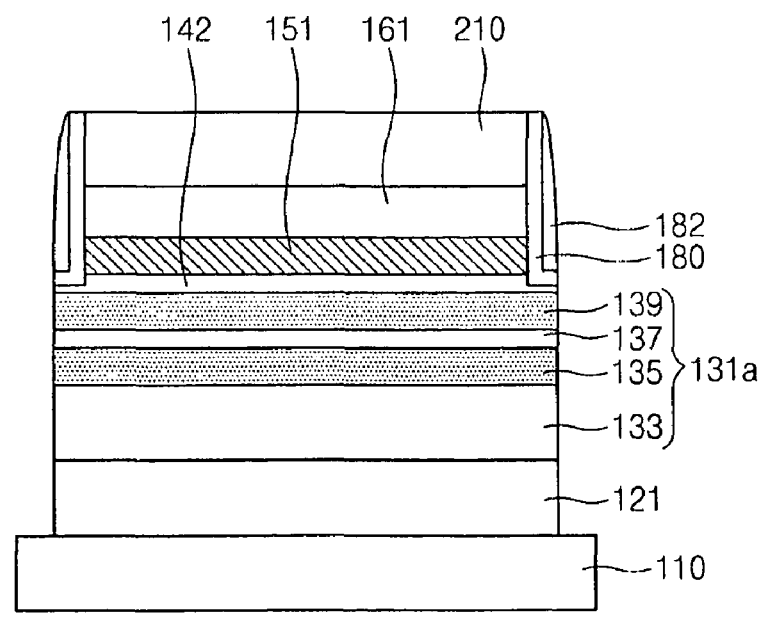

Referring to FIG. 12, the secondary etching process may be performed using the mask pattern 210, the second magnetic conductive pattern 151, and the spacers 180 and 182 as a mask. The first magnetic conductor layer 130a and the tunnel barrier layer 141 are etched by the secondary etching process and a first magnetic conductive pattern 131a and a tunnel barrier pattern 142 are formed.

The sidewall of the first magnetic conductive pattern 131a may be self-aligned with the sidewalls of the spacers 180 and 182. In this case, a lower sidewall of the tunnel barrier layer 141 may also be self-aligned with the sidewalls of the spacers 180 and 182 and the first magnetic conductive pattern 131a.

The lower electrode layer 120 is also etched in the secondary etching process to form a lower electrode 121.

The secondary etching process may be performed by sputtering. For example, the secondary etching process may be performed by ion sputtering.

In the secondary etching process, the sidewall of the second magnetic conductive pattern 151 and the upper sidewall of the tunnel barrier layer 141 may not be exposed. Accordingly, it can minimize attaching the etching by-products generated in the secondary etching process to the sidewalls of second magnetic conductive pattern 151 and/or the tunnel barrier layer 141. Further, a separate masking process may not be required for the secondary etching process. Accordingly, the accuracy and facility of processing may be improved.

The mask pattern 210 may be removed after and/or during the secondary etching process. The spacers 180 and 182 may be removed after and/or during the secondary etching process, or may remain on the sidewalls of the second magnetic conductive pattern 151.

A magnetic memory device according to still another exemplary embodiment will be described with reference to FIG. 12. Some of details described with reference to FIGS. 10 to 12 may be omitted.

Lower and upper electrodes 121 and 161 are disposed on a substrate 110. A first magnetic conductive pattern 131a, a second magnetic conductive pattern 151, and a tunnel barrier pattern 142 provided between the first and second magnetic conductive patterns 131a and 151 may be interposed between the lower and upper electrodes 121 and 161. The first magnetic conductive pattern 131a, the second magnetic conductive pattern 151, and the tunnel barrier pattern 142 may be laminated in another order unlike in FIG. 12. For example, the second magnetic conductive pattern 151, the tunnel barrier pattern 142, and the first magnetic conductive pattern 131a may be laminated sequentially on the substrate 110.

The first magnetic conductive pattern 131 may include a layer that has a magnetization direction fixed in one direction. In addition, the first magnetic conductive pattern 131a may further include a layer for fixing the magnetization direction of the layer. For example, the first magnetic conductive pattern 131a may include a pinning magnetic pattern 133 adjacent to the lower electrode 121 and pinned magnetic patterns 135 and 139 having the magnetization directions fixed by the pinning magnetic pattern 133. Among the pinned magnetic patterns 135 and 139, the first pinned magnetic pattern 135 adjacent to the pinning magnetic pattern 133 may have the magnetization direction fixed in one direction by the pinning magnetic pattern 133. The magnetization directions of the first and second pinned magnetic patterns 135 and 139 may be fixed to be antiparallel with respect to each other by a nonmagnetic layer 137 interposed between the pinned magnetic patterns 135 and 139. In an embodiment, the pinned magnetic patterns 135 and 139 may include ferromagnetic materials.

The sidewall of the tunnel barrier pattern 142 may include portions that are coplanar with the sidewalls of the first conductive pattern 131a and portions that are coplanar with the sidewalls of the second magnetic conductive pattern 151. In the exemplary embodiment, the tunnel barrier pattern 142 may include a plurality of portions that have different widths, one portion having a large width may include a sidewall that is coplanar with the sidewall of the first conductive pattern 131a, and another portion having a small width may include a sidewall that is coplanar with the sidewall of the second magnetic conductive pattern 151.

The second magnetic conductive pattern 151 may include a layer including a material having a changeable magnetization direction. For example, the second magnetic conductive pattern 151 may include layers that include ferromagnetic materials. In the exemplary embodiment, the second magnetic pattern 151 may be formed a plurality of layers. For example, the second magnetic conductive pattern 151 may include a plurality of layers. That is, the second magnetic conductive pattern 151 may include layers that include a plurality of electromagnetic materials and nonmagnetic layers that are provided between layers including the plurality of electromagnetic materials.

In an embodiment, as shown in FIG. 12, a mask pattern 210 may be disposed on the upper surface of the second magnetic pattern 151. Spacers 180 and 182 may be disposed on at least one sidewall of the second magnetic pattern 151. In other embodiments, the mask pattern 210 and/or the spacers 180 and 182 may be omitted.

According to the exemplary embodiment, the first magnetic conductor, the tunnel barrier layer, the second magnetic conductor, and the mask pattern may be formed on the substrate. Primary etching may be performed using the mask pattern as an etching mask. The spacers may be formed on the sidewall of the second magnetic conductor that are etched by the primary etching, and the secondary etching may be performed using the spacers and the mask pattern as an etching mask. Since the sidewalls of the primarily etched second magnetic conductor are covered by the spacers, it may be possible to prevent the etching of by-products, which may be formed during the secondary etching, from coming in contact with the primarily etched second magnetic conductor. This can prevent a shorting phenomenon of the magnetic memory cell. Additionally, since the secondary etching uses the spacers and the mask pattern as an etching mask, an additional masking process may not be essential for the secondary etching. Accordingly, it can simplify the process and prevent misalignment, which may occur in the secondary etching.

Although the inventive concepts have been described in connection with the embodiments illustrated in the accompanying drawings, it is not limited thereto. It will be apparent to those skilled in the art that various substitution, modifications and changes may be thereto without departing from the scope and spirit of the inventive concepts.

What is claimed is:

1. A method of forming a magnetic memory device, comprising:
    sequentially forming a first magnetic conductor, a tunnel barrier layer, and a second magnetic conductor on a substrate;
    forming a mask pattern on the second magnetic conductor;
    performing a primary etching of the second magnetic conductor by using the mask pattern as an etching mask;
    forming at least one spacer on a sidewall of the second magnetic conductor formed by the primary etching; and
    performing a secondary etching of the first magnetic conductor by using the mask pattern and the at least one spacer as an etching mask,
    wherein the first magnetic conductor includes a pinning layer and a pinned layer that are laminated, the pinned layer being formed between the pinning layer and the tunnel barrier layer,
    wherein a portion of the pinned layer and the tunnel barrier layer are etched during the primary etching,
    wherein the at least one spacer is formed on a sidewall of the second magnetic conductor, a sidewall of the tunnel barrier layer, and a sidewall of the pinned layer formed by the primary etching, and
    wherein a bottom of the at least one spacer is higher than a bottom of the pinned layer and lower than a top of the pinned layer.

2. The method as set forth in claim 1, wherein the pinned layer includes a first ferromagnetic layer and a second ferromagnetic layer, and the first magnetic conductor further includes a nonmagnetic layer interposed between the first ferromagnetic layer and the second ferromagnetic layer, and wherein a portion of the second ferromagnetic layer, the second magnetic conductor, and the tunnel barrier layer are etched by the primary etching.

3. The method as set forth in claim 2, wherein the at least one spacer is formed on a sidewall of the tunnel barrier layer, a sidewall of the second magnetic conductor, and a portion of at least one sidewall of the second ferromagnetic layer, which are formed by the primary etching.

4. The method as set forth in claim 1, wherein the first magnetic conductor includes a plurality of layers, wherein at least one of the plurality of layers includes a precious metal, and wherein the at least one layer including precious metals is not exposed before the secondary etching.

5. The method as set forth in claim 1, wherein the at least one spacer includes a plurality of layers.

6. The method as set forth in claim 1, wherein a portion of the pinned layer exposed from the at least one spacer is etched during the secondary etching.

7. A method of forming a magnetic memory device, comprising:
    sequentially forming a first magnetic conductor, a tunnel barrier layer, and a second magnetic conductor on a substrate;
    forming a mask pattern on the second magnetic conductor;
    performing a primary etching of the second magnetic conductor by using the mask pattern as an etching mask;
    forming at least one spacer on a sidewall of the second magnetic conductor formed by the primary etching; and
    performing a secondary etching of the first magnetic conductor by using the mask pattern and the at least one spacer as an etching mask,
    wherein a portion of the tunnel barrier layer is etched during the primary etching,
    wherein a portion of the tunnel barrier layer exposed from the at least one spacer is etched during the secondary etching, and
    wherein a bottom of the at least one spacer is lower than a top of the tunnel barrier layer and higher than a bottom of the tunnel barrier layer.

8. The method as set forth in claim 7, wherein the at least one spacer is formed on a sidewall of the second magnetic conductor and a sidewall of the portion of the tunnel barrier layer formed by the primary etching.

9. The method as set forth in claim 7, wherein the pinned layer includes a first ferromagnetic layer and a second ferromagnetic layer, and the first magnetic conductor further includes a nonmagnetic layer interposed between the first ferromagnetic layer and the second ferromagnetic layer.

* * * * *